United States Patent [19]

Miki

[11] Patent Number: 5,048,020
[45] Date of Patent: Sep. 10, 1991

[54] ELECTRONIC DISK SUBSYSTEM

[75] Inventor: Kazumichi Miki, Tokyo, Japan

[73] Assignee: NEC Corporation, Tokyo, Japan

[21] Appl. No.: 557,080

[22] Filed: Jul. 25, 1990

[30] Foreign Application Priority Data

Jul. 25, 1989 [JP] Japan .................................. 1-192167

[51] Int. Cl.$^5$ ............................................. G06F 11/00
[52] U.S. Cl. ................................. 371/21.2; 364/265.3; 364/285.4
[58] Field of Search ........................................ 371/21.2; 364/200 MS File, 900 MS File

[56] References Cited

U.S. PATENT DOCUMENTS

| 4,737,936 | 11/1988 | Takeuchi | 371/21.2 |
| 4,744,061 | 5/1988 | Takemae et al. | 371/21.2 |
| 4,811,294 | 3/1989 | Kobayashi et al. | 371/21.2 |
| 4,835,774 | 5/1989 | Ooshima et al. | 371/21.2 |
| 4,860,259 | 8/1989 | Tobita | 371/21.2 |

Primary Examiner—Allen R. MacDonald
Assistant Examiner—Debra A. Chun
Attorney, Agent, or Firm—Foley & Lardner

[57] ABSTRACT

An electronic disk subsystem for use with data processing equipment has an electronic disk control unit and an electronic disk unit and compares, in a write mode operation, the address of the last data with the content of a counter which is built in the disk unit. The subsystem, therefore, reliably detects an error which may occur in the counter.

5 Claims, 1 Drawing Sheet

ELECTRONIC DISK SUBSYSTEM

BACKGROUND OF THE INVENTION

The present invention relates to an electronic disk subsystem for use with a data processing apparatus and, more particularly, to an electronic disk subsystem capable of reliably confirming the writing of data into an electronic disk unit thereof.

It has been customary with an electronic disk subsystem for the above application to cause an electronic disk unit thereof to confirm data written during a write mode operation by a read-after-write procedure. The problem with such a subsystem is as follows. Assume that an error has occurred in a counter built in the disk unit, e.g., the counter is not incremented due to an error although the start address for data transfer has been successfully loaded therein. Then, data would be written to the same address at all times, and the read-after-write operation would be effected at the same address, preventing the subsystem from detecting the error.

SUMMARY OF THE INVENTION

It is therefore an object of the present invention to provide an electronic disk subsystem which is free from the problem particular to the prior art as discussed above.

It is another object of the present invention to provide a generally improved electronic disk subsystem.

In an electronic disk subsystem comprising an electronic disk control unit connected to a host by an upper-layer bus, and an electronic disk unit connected to the electronic disk control unit by a lower-layer bus of the present invention, the electronic disk control unit comprises a start address register for storing a start address for data transfer, a byte number register for storing the number of bytes of data to be transferred, an adder for adding the content of the start address register and the content of the byte number register, and a switching circuit for selectively feeding either one of the output of the adder and the output of the host to the lower-layer bus. The electronic disk unit comprises a storage unit for storing the output of the switching circuit as data, a byte number counter for storing the number of bytes of data to be transferred which is decremented every time data is transferred, a last address data reading circuit for reading the last data out of the storage unit, an address counter for storing the start address which is incremented every time data is transferred, and a comparator for comparing the last address data read out by the last data reading circuit and the content of the address counter. The switching circuit feeds, after the end of all outputs from the host, the output of the adder to the storage unit as the last address data, the last data reading circuit reads the last address data out of the storage unit when the byte number counter is decremented to zero, and the comparator compares the last address data and the content of the address counter.

BRIEF DESCRIPTION OF THE DRAWING

The above and other objects, features and advantages of the present invention will become more apparent from the following detailed description taken with the accompanying drawing in which.

DESCRIPTION OF THE PREFERRED EMBODIMENT

Figure 1:
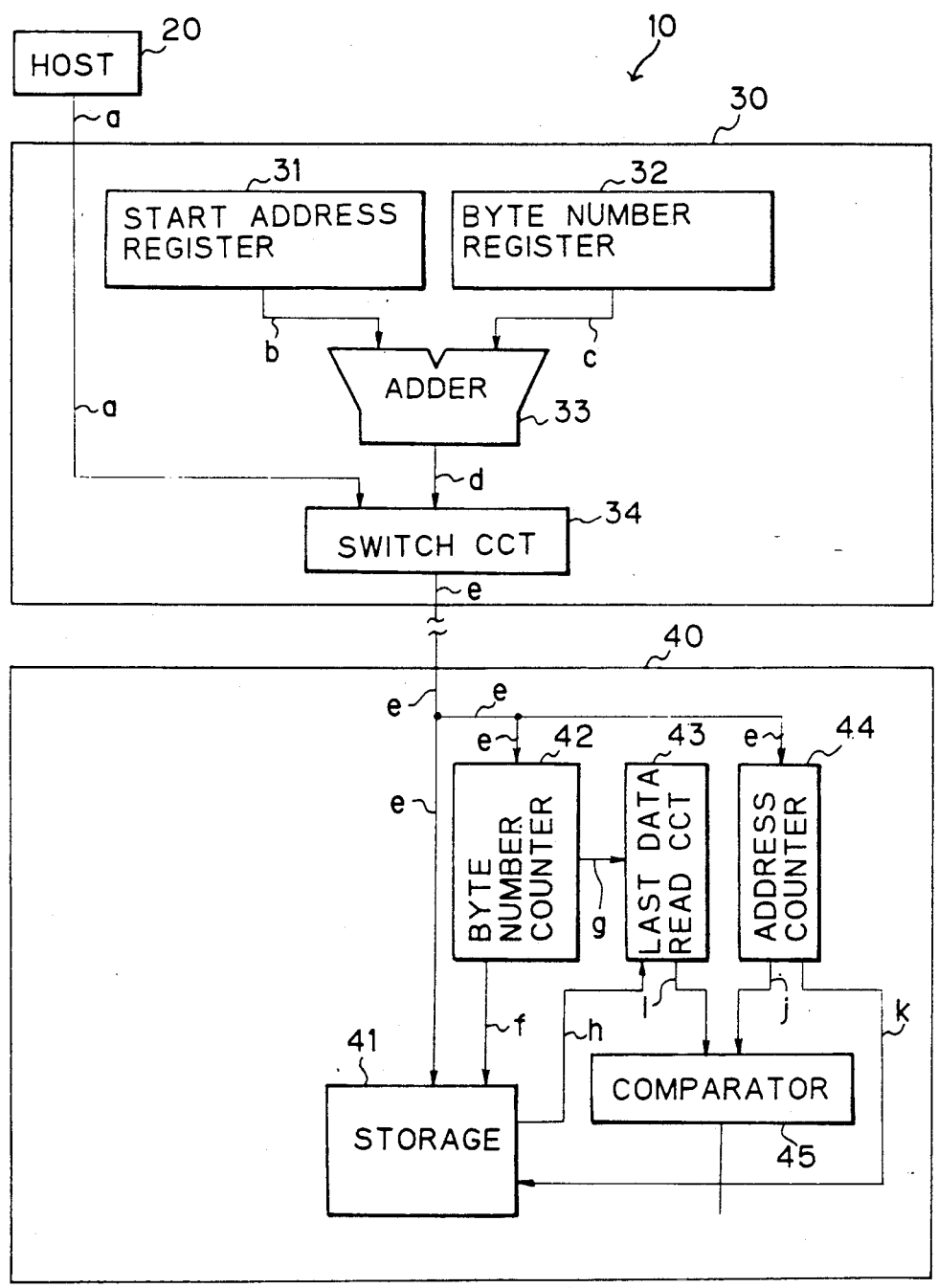
FIG. 1 is a block diagram schematically showing an electronic disk subsystem embodying the present invention.

Referring to FIG. 1, an electronic disk subsystem embodying the present invention is shown. As shown, the subsystem, generally 10, has an electronic disc control unit 30 whose input is connected to the output of a host 20 by an upper layer bus or signal line a. The control unit 30 has a start address register 31, a byte number register 32 for storing the number of bytes to be transferred, an adder 33, and a switching circuit 34. The outputs of the start address register 31 and byte number register 32 are connected to the input of the adder 33 by signal lines b and c, respectively. The output of the adder 33 is connected to the switching circuit 34 by a lower-layer bus or signal line d. The output of the switching circuit 34 is connected to an electronic disk unit 40 by a signal line e. The disk unit 40 has a storage unit 41, a byte number counter 42 for counting the number of bytes transferred, a last data reading circuit 43, an address counter 44, and a comparator 45. The output of the control unit 30 is connected to the storage unit 41, byte number counter 42, last data reading circuit 43, and address counter 44 by the signal line e. The output of the byte number counter 42 is connected to the storage unit 41 and last data reading circuit 43 by signal lines f and g, respectively. The outputs of the last data reading circuit 43 and address counter 44 are connected to the comparator 45 by signal lines i and j, respectively. The output of the address counter 44 is connected to the storage unit 41 by a signal line k, while the output of the storage unit 41 is connected to the last data reading circuit 43 by a signal line h.

In operation, as the host 20 delivers a write command to the control unit 30, a start address is set in the start address register 31 while the sum of the number of bytes to be transferred or the number of bytes of data to be fed out as last data is set in the byte number register 32. At the same time, the same contents in the start address register 31 and byte number register 32 are loaded in, respectively, the address counter 44 and byte number counter 42 by way of the signal line e. In a write mode operation, the switching circuit 34 is so conditioned as to route write data from the host 20 to the storage unit 41 of the disk unit 40 over the signal line e. Every time data is transferred, the byte number counter 42 and address counter 44 are decremented and incremented, respectively. As soon as the write data from the host 20 ends, the switching circuit 34 is conditioned to feed the output of the adder 33 to the disk unit 40 over the signal line e. When the byte number counter 42 is decremented to zero, the disk unit 40 causes the last data reading circuit 43 to read the output of the adder 33 of the control unit 30 from storage unit 41 as the last address data. Then, the comparator 45 compares the last data has been transferred to storage unit 41 and the content of the address counter 44, thereby confirming the write data.

In summary, it will be seen that the present invention provides an electronic disk subsystem which in a write mode operation checks the address of the last data and, therefore, reliably detects an error which may occur in a counter built in an electronic disk unit thereof.

Various modifications will become possible for those skilled in the art after being provided with the teachings of the present disclosure without departing from the scope thereof.

What is claimed is:

1. An electronic disk subsystem, comprising:

an electronic disk control unit connected to a host by an upper-layer bus; and an electronic disk unit connected to said electronic disk control unit by a lower-layer bus;

said electronic disk control unit comprising start address register means for storing a start address for data transfer which is inputted from said upper layer bus at a beginning of a transfer of write data, byte number register means for storing a number bytes of data to be transferred which is inputted from said upper-layer bus at said beginning of said transfer of said write data, adder means for adding a content of said start address register means and a content of said byte number register means when data to be transferred from said electronic disk control unit to electronic disk unit are exhausted, and switching means for selectively feeding either one of an output of said adder means and an output of said host to said lower-layer bus;

said electronic disk unit comprising storage means for storing an output of said switching means as data, byte number counter means for storing said number of bytes of data to be transferred which is inputted from said upper-layer bus via said electronic disk unit at said beginning of said transfer of said write data and being decremented by a number of transferred bytes every time said data is transferred, last data reading means for reading last data which is a write data transfer end address out of said storage means, address counter means for storing said start address inputted from said upper-layer bus via said electronic disk control unit at said beginning of said transfer of said write data and incremented by said number of transferred bytes every time said data is transferred, and comparator means for comparing said last data read out by said last data reading means and a content of said address counter means;

said switching means feeding, when data to be transferred from said electronic disk control unit to said electronic disk unit are exhausted subsequent to said output of said host, said output of said adder means to said storage means as last data;

said last data reading means reading said last data out of said storage means when said byte number counter means is decremented to zero;

said comparator means comparing said last data and said content of said address counter means.

2. An electronic disk system, comprising:

input means for supplying a given plurality of bytes of data including a last byte;

means for calculating a last address for said last byte of said given plurality of bytes and outputting a calculated last address;

means for storing said given plurality of bytes and said calculated last address;

switching means for providing for byte transfer of said given plurality of bytes to said means for storing and, after transfer of said last byte, for providing for address transfer of said calculated last address to said means for storing;

first means, responsive to said byte transfer, for providing a first indication of transfer completion of said given plurality of bytes;

second means, responsive to said byte transfer, for providing a second indication of transfer completion of said given plurality of bytes;

comparison means for comparing said second indication with said calculated last address;

means for inputting said second indication to said comparison means; and means responsive to said first indication for reading said calculated last address from said means for storing and inputting said calculated last address to said comparison means.

3. A system as in claim 2, wherein said means for calculating increases a starting address by an amount indicative of said given plurality of said bytes to produce said calculated last address.

4. A system as in claim 2, wherein said first means for providing a first indication comprises a decrementing counter for counting from an initial setting corresponding to said amount indicative of said given plurality of said bytes.

5. A system as in claim 2, wherein said second means for providing a second indication comprises an incrementing counter for counter from an initial setting of said starting address.

* * * * *